United States Patent
Huang et al.

(10) Patent No.: US 9,101,086 B2
(45) Date of Patent: Aug. 4, 2015

(54) ACCESS PANELS FOR ELECTRONIC DEVICES

(71) Applicant: Research in Motion Limited, Waterloo (CA)

(72) Inventors: Li Huang, Kitchener (CA); Timothy Herbert Kyowski, Kitchener (CA); James Infanti, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 279 days.

(21) Appl. No.: 13/742,003

(22) Filed: Jan. 15, 2013

(65) Prior Publication Data

US 2014/0198432 A1  Jul. 17, 2014

(51) Int. Cl.
- *G06F 1/16* (2006.01)
- *H05K 13/00* (2006.01)
- *H05K 5/02* (2006.01)

(52) U.S. Cl.
CPC ............. *H05K 13/00* (2013.01); *H05K 5/0239* (2013.01); *Y10T 29/49863* (2015.01)

(58) Field of Classification Search
None
See application file for complete search history.

(56) References Cited

U.S. PATENT DOCUMENTS

| | | | | |
|---|---|---|---|---|
| 3,432,967 A | * | 3/1969 | Horst | 220/326 |
| 3,999,110 A | * | 12/1976 | Ramstrom et al. | 320/112 |
| 5,206,098 A | * | 4/1993 | Cho et al. | 429/96 |
| 5,358,135 A | * | 10/1994 | Robbins et al. | 220/834 |
| 5,372,395 A | | 12/1994 | Yang | |
| 5,671,274 A | | 9/1997 | Kotaka | |
| 6,095,364 A | * | 8/2000 | Dickie et al. | 220/259.5 |
| 6,189,938 B1 | | 2/2001 | Nakadaira et al. | |
| 6,401,299 B1 | * | 6/2002 | Schwarz | 16/335 |
| 6,409,042 B1 | * | 6/2002 | Hirano et al. | 220/812 |
| 6,515,855 B1 | * | 2/2003 | Removedummy | 361/679.33 |
| 6,603,655 B2 | | 8/2003 | Hrehor, Jr. et al. | |
| 6,948,217 B2 | | 9/2005 | Higano et al. | |
| 7,124,472 B2 | | 10/2006 | Duan et al. | |
| 7,836,554 B2 | | 11/2010 | Fu | |
| 7,905,524 B2 | * | 3/2011 | Migli | 292/220 |
| 8,023,263 B2 | * | 9/2011 | Crippen et al. | 361/679.58 |
| 8,369,080 B2 | * | 2/2013 | Huang | 361/679.38 |
| 8,444,005 B2 | * | 5/2013 | Kawai et al. | 220/811 |
| 8,605,451 B2 | * | 12/2013 | Tang | 361/754 |
| 2003/0128527 A1 | * | 7/2003 | Chewning | 361/747 |

(Continued)

FOREIGN PATENT DOCUMENTS

EP  1860710 A1  11/2007

OTHER PUBLICATIONS

European Search Report in European Application No. 13151349.1, dated Jun. 26, 2013, 8 pages.

*Primary Examiner* — Anthony Q Edwards
(74) *Attorney, Agent, or Firm* — Fish & Richardson P.C.

(57) ABSTRACT

Access Panels for electronic devices are disclosed herein. An example electronic device disclosed herein includes a housing having an opening to access a card holder and an access panel coupled to the housing to cover the opening. The access panel slides and rotates relative to the housing when the access panel moves between an open position to allow access to the opening and a closed position to cover the opening. A first biasing element has a first end attached to the access panel and a second end attached to the housing and biases the access panel laterally relative to the housing. A second biasing element is coupled to the access panel to cause the access panel to rotate in a first rotational direction relative to the housing.

19 Claims, 10 Drawing Sheets

Fig. 7

(56) References Cited

U.S. PATENT DOCUMENTS

| | | | |
|---|---|---|---|
| 2004/0224556 A1* | 11/2004 | Qin et al. | 439/500 |
| 2007/0205208 A1 | 9/2007 | Ueda | |
| 2009/0141445 A1* | 6/2009 | Lu | 361/679.55 |
| 2011/0273832 A1* | 11/2011 | Tracy et al. | 361/679.31 |
| 2012/0257368 A1* | 10/2012 | Bohn et al. | 361/809 |
| 2014/0061216 A1* | 3/2014 | Lee | 220/837 |
| 2014/0139083 A1* | 5/2014 | Beni et al. | 312/242 |

* cited by examiner

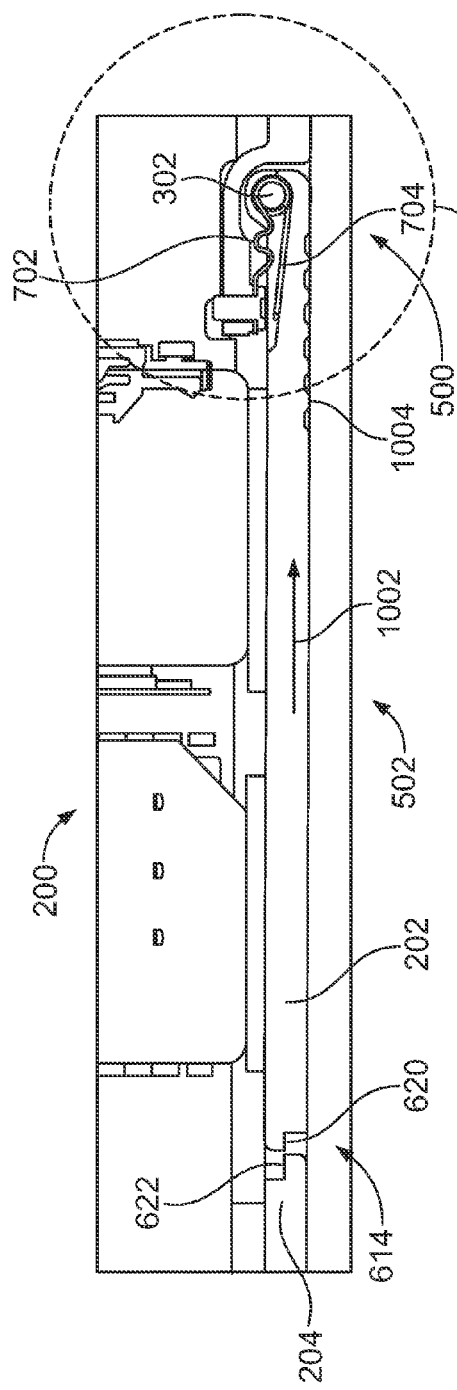
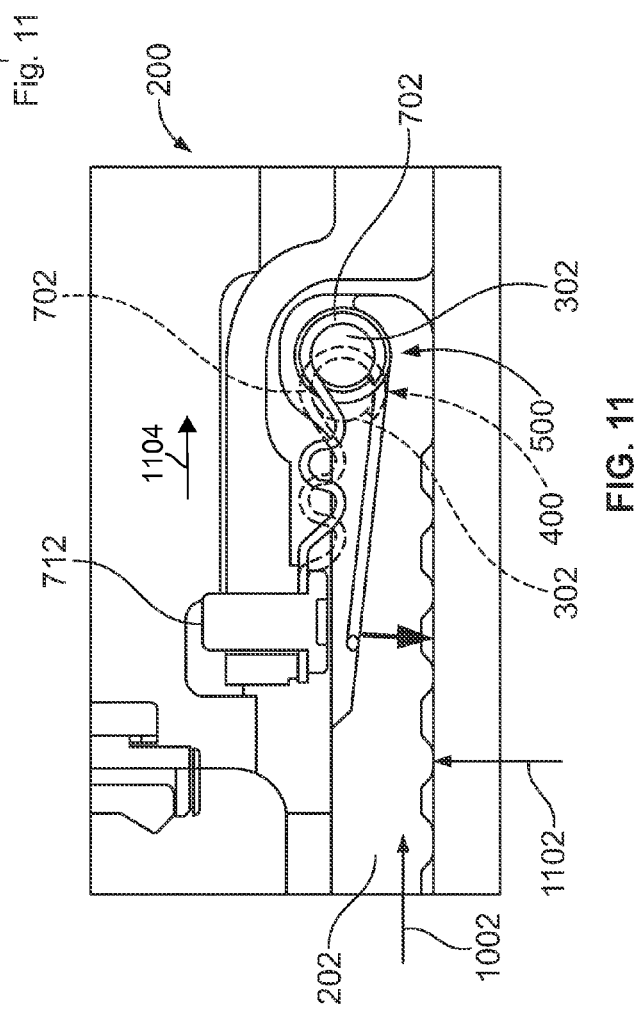

US 9,101,086 B2

ACCESS PANELS FOR ELECTRONIC DEVICES

FIELD OF DISCLOSURE

The present disclosure relates to electronic devices, including but not limited to, access panel for electronic devices.

BACKGROUND

Electronic devices, including portable electronic devices, have gained widespread use and may provide a variety of functions including, for example, telephonic, electronic messaging and other personal information manager (PIM) application functions, digital cameras and the like. Portable electronic devices include, for example, several types of mobile stations such as simple cellular telephones, smart phones, wireless personal digital assistants (PDAs), and laptop computers with wireless 802.11 or Bluetooth capabilities.

Known electronic devices often employ a card holder to receive a Subscriber Identification Module card, a memory card (SD card) and/or other smart card(s). For example, electronic devices such as, for example, portable electronic devices often connect to a network (e.g., a mobile network). These devices often employ a SIM card to identify a subscriber for network access and authenticate the subscriber to a network such as a mobile network.

Such cards may be removed and/or coupled to an electronic device. To protect a card holder or card socket (e.g., a card reader) of the electronic device from damage, a housing of the electronic device often employs an access panel or door. However, known panels or doors are often removed or decoupled from the electronic device and/or are retained to the electronic device via a tether (e.g., retaining chain) when the panel or door is detached from the housing to access the card holder. Such known panels and doors are often lost or damaged when remove or decoupled from the electronic device.

BRIEF DESCRIPTION OF THE DRAWINGS

FIG. 10 is a plan view of the example electronic device similar to FIG. 6, but showing the example access panel in an intermediate position between a closed position and an open position.

FIG. 11 is an enlarged view of the example access panel of the electronic device of FIG. 10 when the example access panel is in the intermediate position.

DETAILED DESCRIPTION

Figure 1:
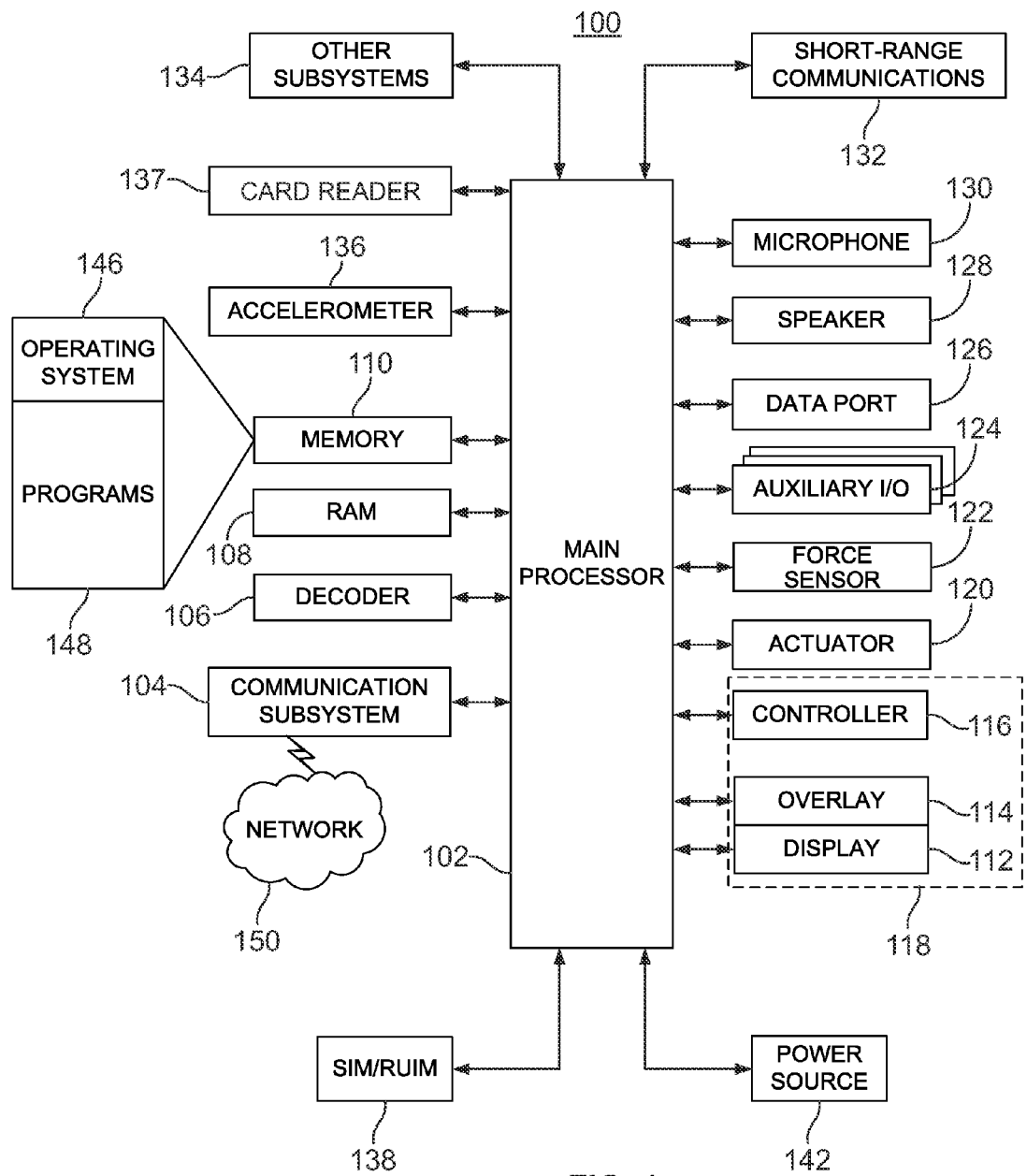
FIG. 1 is a block diagram of an example portable electronic device in accordance with the teachings of this disclosure.

Known electronic devices typically employ a card holder or card socket (e.g., card reader) to receive smart cards (e.g., SIM cards), memory cards (e.g., SD cards) and the like. To enable access to the card holder and/or protect the card holder, known electronic devices employ access panels or doors. The access panels or doors of known electronic devices are typically removed or detached from the electronic housing to enable access to a card holder. In some examples, the access panel or door is tethered to the electronic housing such that the access panel hangs or suspends from the housing when the door or panel is in an open position. Such known configurations often result in loss of the access panel and/or the access panel becoming damaged. In other known examples, an access panel or door is pivotally coupled to the housing that typically require locking tabs or latches to retain the access panel or door in a closed position, which require a user to manually activate the lock when positioning the access panel or door to a closed position. As a result, a user may need to use both hands to open or close an access panel.

Example access panels or doors disclosed herein employ a bi-directional biasing element that enables single hand operation to open and close the example access panels or doors of an electronic device. For example, an example access panel disclosed herein can be biased in a first direction (e.g., substantially horizontally or laterally relative to a housing) and a second direction (e.g., rotationally relative to the housing). In some examples, the bi-directional biasing element may include an assembly having a first biasing element to laterally bias an example access panel or door and a second biasing element to rotatably bias the example access panel or door. However, in other examples, a single biasing element may be configured to provide a biasing force in a first lateral direction (e.g., a linear force) and a biasing force in a first rotational direction. In addition, the example access panels or doors disclosed herein are hinged to a housing of an electronic device and remain attached to the electronic device when the access panel or door is in an open position, thereby preventing damage and/or becoming lost when the access panel is in an open position.

Additionally or alternatively, the example access panels or doors disclosed herein lock automatically upon movement of the access panel to the closed position. Once in the closed position, the biasing element biases the access panel or door in the closed position toward a locking feature. In some examples, the example access panels disclosed herein are substantially flush with a housing of the electronic device to provide a substantially seamless profile. In other words, the example access panels disclosed herein provide a relatively small gap between a perimeter of the access panels and a housing of an electronic device.

For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

The disclosure generally relates to an electronic device, such as a portable electronic device, non-portable electronic device and/or any other device (e.g., non-electronic device) having a housing that includes an access opening. Examples of portable electronic devices include mobile, or handheld, wireless communication devices such as pagers, cellular phones, cellular smart-phones, wireless organizers, personal digital assistants, wirelessly enabled notebook computers, tablet computers, mobile internet devices, electronic navigation devices, and so forth. The portable electronic device may be a portable electronic device without wireless communication capabilities, such as handheld electronic games, digital photograph albums, digital cameras, media players, e-book readers, and/or any other device(s) that includes a housing having an access opening. Examples of non-portable electronic devices include desktop computers, electronic white boards, smart boards utilized for collaboration, built-in monitors or displays in furniture or appliances, and/or any other device having a housing that includes an access opening.

A block diagram of an example portable electronic device 100 is shown in FIG. 1. The portable electronic device 100 includes multiple components, such as a processor 102 that controls the overall operation of the portable electronic device 100. Communication functions, including data and voice communications, are performed through a communication subsystem 104. Data received by the portable electronic device 100 is decompressed and decrypted by a decoder 106. The communication subsystem 104 receives messages from and sends messages to a wireless network 150. The wireless network 150 may be any type of wireless network, including, but not limited to, data wireless networks, voice wireless networks, and networks that support both voice and data communications. A power source 142, such as one or more rechargeable batteries or a port to an external power supply, powers the portable electronic device 100.

The processor 102 interacts with other components, such as a Random Access Memory (RAM) 108, memory 110, a display 118 (e.g., a touch-sensitive display), one or more actuators 120, one or more force sensors 122, an auxiliary input/output I/O subsystem 124, a data port 126, a speaker 128, a microphone 130, short-range communications 132 and other device subsystems 134, a card holder or card socket 137 (e.g., a card reader), etc. The processor 102 may also interact with an accelerometer 136 that may be utilized to detect direction of gravitational forces or gravity-induced reaction forces.

The display 118 may be a touch-sensitive display that includes a display 112 and touch sensors 114 that are coupled to at least one controller 116 that is utilized to interact with the processor 102. Input via a graphical user interface is provided via the display 118. Information, such as text, characters, symbols, images, icons, and other items that may be displayed or rendered on a portable electronic device, is displayed on the display 118 via the processor 102.

The display 118 may be any suitable touch-sensitive display, such as a capacitive, resistive, infrared, surface acoustic wave (SAW) touch-sensitive display, strain gauge, optical imaging, dispersive signal technology, acoustic pulse recognition, and so forth. A capacitive touch-sensitive display, for example, includes one or more capacitive touch sensors. The capacitive touch sensors may comprise any suitable material, such as indium tin oxide (ITO).

To identify a subscriber for network access, the portable electronic device 100 may utilize a Subscriber Identity Module or a Removable User Identity Module (SIM/RUIM) card 138 for communication with a network, such as the wireless network 150. The card holder 137 of the portable electronic device 100 is configured to receive and/or extract the information from the SIM or RUIM. Alternatively, user identification information may be programmed into memory 110.

The portable electronic device 100 includes an operating system 146 and software programs, applications, or components 148 that are executed by the processor 102 and are typically stored in a persistent, updatable store such as the memory 110. Additional applications or programs may be loaded onto the portable electronic device 100 through the wireless network 150, the auxiliary I/O subsystem 124, the data port 126, the short-range communications subsystem 132, or any other suitable device subsystems 134.

A received signal such as a text message, an e-mail message, or web page download is processed by the communication subsystem 104 and input to the processor 102. The processor 102 processes the received signal for output to the display 112 and/or to the auxiliary I/O subsystem 124. A subscriber may generate data items, for example e-mail messages, which may be transmitted over the wireless network 150 through the communication subsystem 104. For voice communications, the overall operation of the portable electronic device 100 is similar. The speaker 128 outputs audible information converted from electrical signals, and the microphone 130 converts audible information into electrical signals for processing.

The methods described herein may be carried out by software executed, for example, by the processor 102. Coding of software for carrying out such a method is within the scope of a person of ordinary skill in the art given the present description. A computer-readable medium having computer-readable code may be executed by at least one processor of the portable electronic device 100 to perform the methods described herein.

Figure 2:
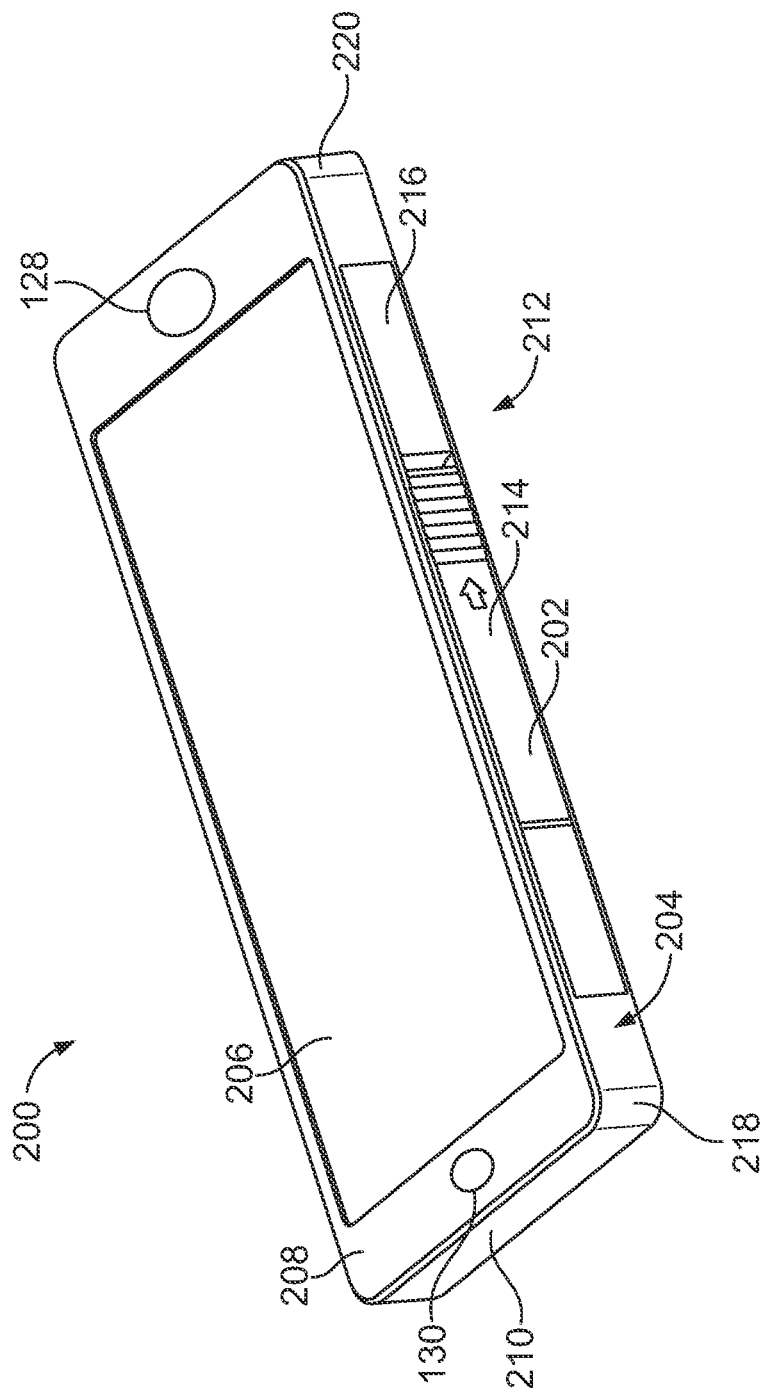
FIG. 2 is an example portable electronic device constructed in accordance with the teaching disclosed herein that may implement the example block diagraph of FIG. 1.

FIG. 2 is a perspective view of an example electronic device 200 having an access panel or door 202 in accordance with the teachings disclosed herein. In the example of FIG. 2, the example electric device 200 is a handheld communication device or mobile phone. The electronic device 200 may be a data and/or voice-enabled handheld device that may be used to send and receive a message, a voice communication, a textual entry, etc. The electronic device 200 includes a housing 204 that can be held in one hand by a user of the electronic device 200 during data (e.g., text) and/or voice communications.

The housing 204 encloses electronic or mobile components such as, for example, the electronic components described above in connection with FIG. 1. For example, the housing 204 encloses the display 118, the speaker 128, the microphone 130, the auxiliary I/O 124, the data port 126, etc. In the example of FIG. 2, a user interacts with the example electronic device 200 via the display 118 to choose commands, execute application programs, and perform other functions by selecting menu items or icons by contacting or touching the icon or image via the display 118. The housing 204 may include an opening or transparent area 206 to enable viewing and/or interaction with the display 118.

The housing 204 of the illustrated example includes a first housing portion 208 (e.g., an upper housing, lid or base) that couples to a second housing portion 210 (e.g., a lower housing, lid or base) to capture the electronic components within the housing 204. In some examples, the first housing portion 208 may be a rear or bottom cover to enable access to, for example, a battery of an electronic device. As shown in FIG. 2, the access panel 202 is coupled to the housing 204 to cover an opening of the housing 204 that provides access to a card holder. The opening, for example, may provide access to a card holder that interacts with a Subscriber Identification Module card, a memory card (e.g., an SD card) and/or any other smart card(s). In the illustrated example, the access panel 202 is slidably and rotatably coupled relative to the housing 204 to enable access to the opening of the housing 204. When coupled to the housing 204 as shown in FIG. 2, the access panel 202 defines at least a portion of a side surface 212 of the housing 204. In particular, an outer surface 214 of the access panel 202 is substantially flush (e.g., flush mounted) with an outer surface 216 of the housing 204 when the access panel 202 is in a position shown in FIG. 2 (e.g., a closed position). Further, a gap between a perimeter of the access panel 202 and portions of the housing 204 surrounding the perimeter of the access panel 202 is relatively small. As a result, the access panel 202 provides a relatively seamless profile when the access panel 202 is coupled to the housing 204.

Further, the access panel 202 can be positioned between a first edge or end 218 (e.g., a first corner) of the side surface 212 and a second edge or end 220 (e.g., a second corner) of the side surface 212. As a result, the access panel 202 may be positioned at approximately a midpoint between the first and second edges 218 and 220. In other words, the access panel 202 can be positioned away from the first edge 218 and/or the second edge 220. The side surface 212 of the illustrated example is positioned substantially perpendicular relative to the display 118. However, in other examples, the access panel 202 may be positioned on a back cover, a lid, a side surface and/or any other surface of the housing 204.

Figure 3:
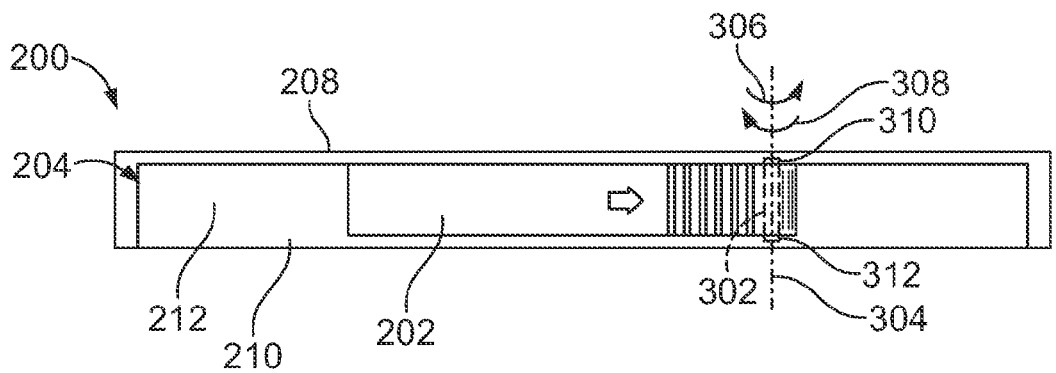
FIG. 3 is side view of an example electronic device of FIG. 2 illustrating an example access panel of the electronic device in a closed position.

FIG. 3 illustrates a side view of the example electronic device 200 of FIG. 2. Referring to FIG. 3, the access panel 202 is coupled to the housing 204 via a hinge 302. In this example, the hinge 302 defines a longitudinal axis or pivot axis 304 about which the access panel 202 rotates relative to the housing 204 between an open position to enable access to an opening of the side surface 212 and a closed position to prevent access and/or cover the opening of the side surface 212. More specifically, the access panel 202 rotates about the hinge 302 in a first rotational direction 306 about the pivot axis 304 of the hinge 302 to move the access panel 202 to an open position. The access panel 202 rotates about the hinge 302 in a second rotational direction 308 about the pivot axis 304 to move the access panel 202 to a closed position (e.g., the position shown in FIG. 3). To enable the access panel 202 to rotate relative to the housing 204, the hinge 302 is captured or positioned between the first and second housing portions 208 and 210. As shown in FIG. 3, a first portion 310 of the hinge 302 engages the first housing portion 208 and a second portion 312 of the hinge 302 engages the second housing portion 210. Further, the access panel 202 of the illustrated example can shift laterally (e.g., substantially horizontal or sideways) relative to the housing 204. In particular, the pivot axis 304 and/or the hinge 302 can shift laterally and/or parallel relative to the side surface 212 of the housing 204 when the access panel moves between a closed position and an open position.

Figure 4:
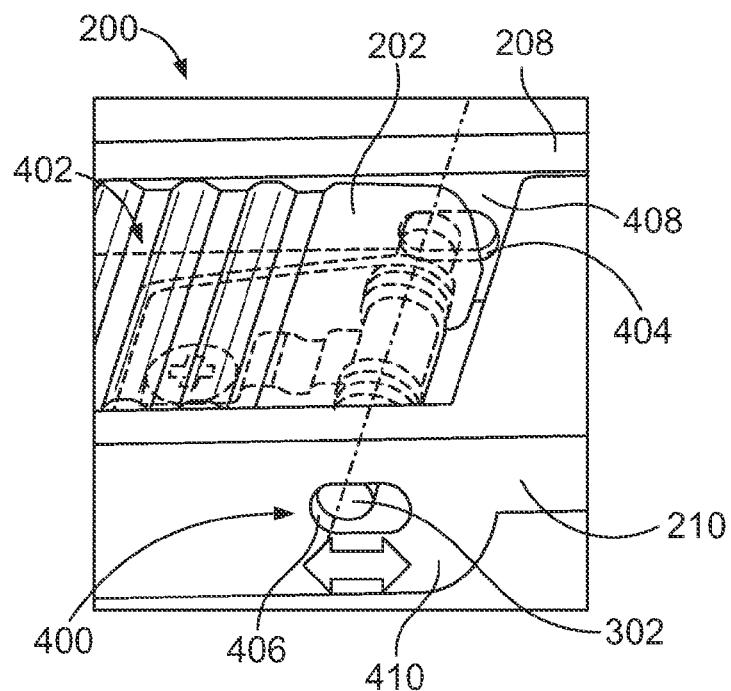
FIG. 4 is an enlarged view of the example electronic device of FIGS. 2 and 3 showing the example access panel in a first lateral position.

FIG. 4 is an enlarged view of the example electronic device 200 showing the hinge 302 in a first lateral position 400 and the access panel 202 in a closed position 402. As shown in FIG. 4, the hinge 302 of the access panel 202 is positioned between the first and second housing portions 208 and 210. More specifically, the first portion 310 (FIG. 3) of the hinge 302 is positioned in a slot or opening 404 formed in the first housing portion 208 and the second portion 312 (FIG. 3) of the hinge 302 is positioned in a slot or opening 406 formed in the second housing portion 210. The slots 404 and/or 406 (e.g., blind slots) are formed as elongated apertures (e.g., extending through the surfaces 408 and/or 410) and/or elongated recesses (e.g., partially extending in the surfaces 408 and/or 410) formed in the respective housing portions 208 and 210. The slots 404 and 406 are substantially aligned and are substantially perpendicular relative to the side surface 212 of the housing 204.

Figure 5:
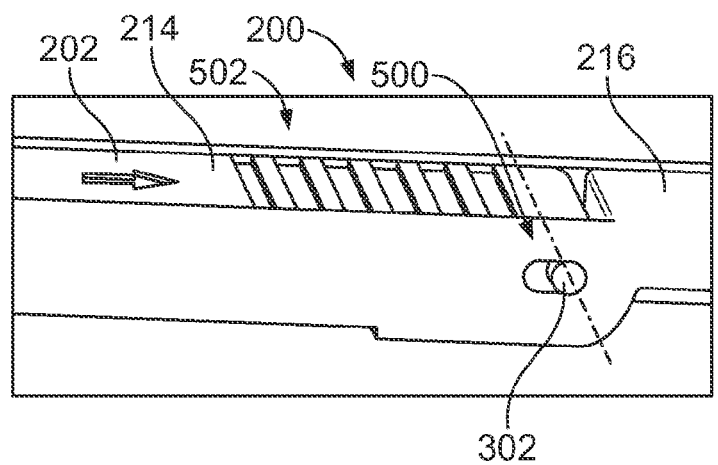
FIG. 5 is another enlarged view of the example electronic device of FIGS. 2-4 showing the example access panel in a second lateral position.

FIG. 5 is an enlarged view of the example electronic device 200 showing the access panel 202 in a second lateral position 500 and the access panel 202 in an intermediate or release position 502. In particular, as described in greater detail below, the access panel 202 slides relative to the housing 204 to move the hinge 302 between the first and second lateral positions 400 and 500. When the hinge 302 is in the second lateral position 500 as shown in FIG. 5, the access panel 202 shifts to the intermediate position 502 to unlock, release or unlatch the access panel 202 from the housing 204. In the intermediate position 500, the outer surface 214 of the access panel 202 is substantially parallel relative to the side surface 216 of the second housing portion 210. However, as described in greater detail below, the access panel 202 is in a release position and is able to rotate about the pivot axis 304 relative to the housing 204.

Figure 6:
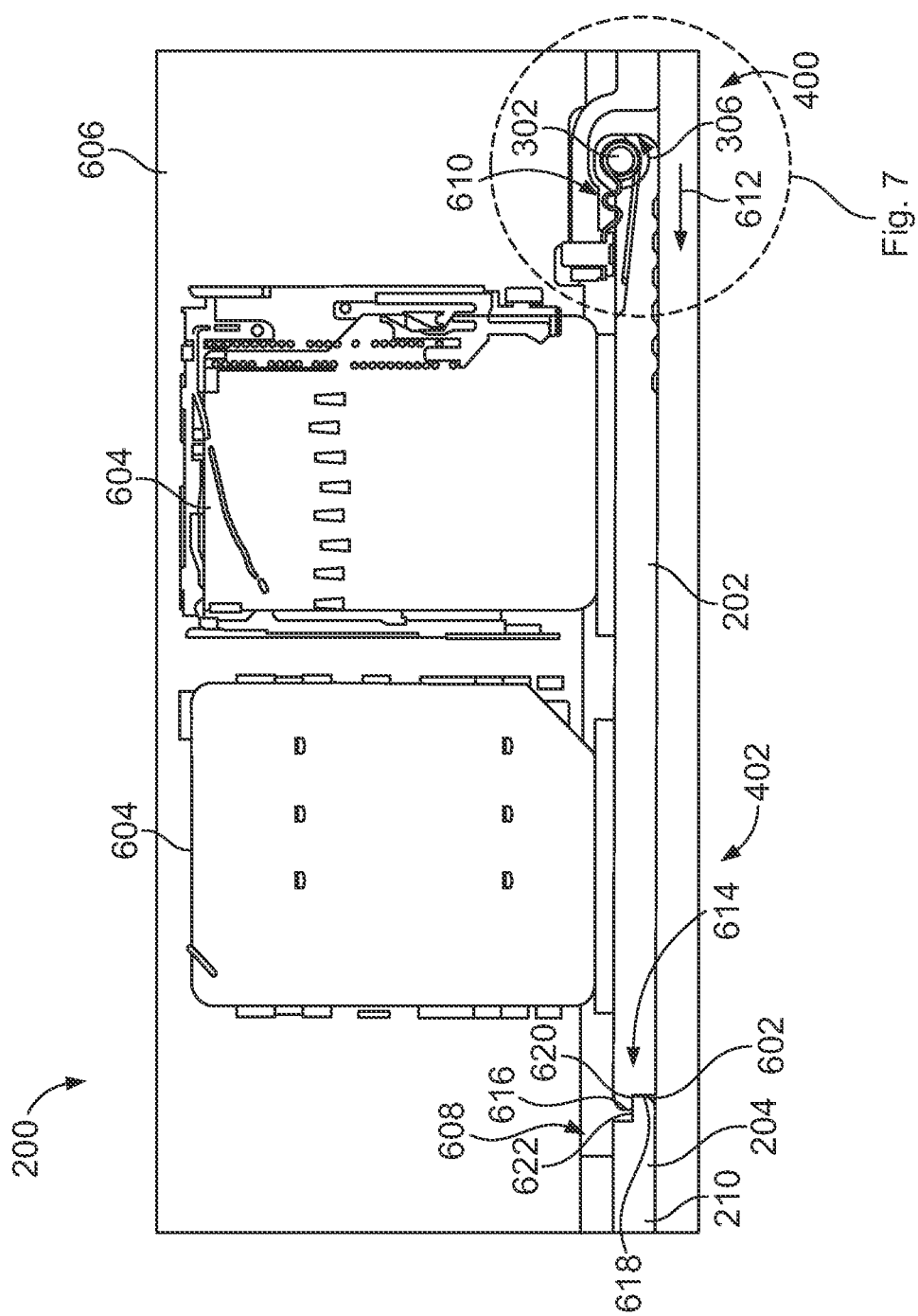
FIG. 6 is a plan view of the example access panel of the electronic device of FIGS. 2-5 having a portion of a housing of the electronic device removed.

FIG. 6 is a partial plan view of the example electronic device 200 of FIGS. 2-5 having the first housing portion 208 of the housing 204 removed. Referring to FIG. 6, the access panel 202 covers an opening 602 of the side surface 212 of the housing 204 when the access panel 202 is in the closed position 402. The opening 602 provides access to one or more card holders or trays 604 coupled to a circuit board 606 positioned inside a cavity 608 defined by the housing 204. The card holders or sockets 604 can receive a SIM card, an SD card and/or any other smart card(s).

The access panel 202 of the illustrated example includes a biasing element or biasing assembly 610. As shown in FIG. 6, the biasing assembly 610 imparts or provides a bi-directional biasing force to the access panel 202. More specifically, the biasing assembly 610 biases the access panel 202 in a first lateral direction 612 and the first rotational direction 306 relative to the side surface 214 of the housing 204. For example, the biasing assembly 610 provides a pulling or leftward biasing force to the access panel 202 in the orientation of FIG. 6 (e.g., a force substantially parallel relative to the side surface 212) and rotational biasing force in a counter clockwise direction in the illustration of FIG. 6.

As shown in FIG. 6, the access panel 202 is in the closed position 402. To retain the access panel 202 in the closed position 402 and prevent the biasing assembly 610 from rotating the access panel 202 in the first rotational direction 306, the example electronic device 200 employs a latch 614. More specifically, to provide the latch 614, an end 616 of the access panel 202 and a portion 618 of the housing 204 (e.g., the second housing portion 210) engage (e.g., frictionally engage) when the access panel 202 is in the closed position 402 and the hinge 302 is in the first lateral position 400. In particular, the latch 614 includes a first shoulder 620 formed by a recess (e.g., a stepped surface or profile) provided in the end 616 of the access panel 202 and a second shoulder 622 formed by a recess (e.g., a stepped profile) provided in the second housing portion 210. The shoulders 620 and 622 engage to prevent rotational movement of the access panel 202 relative to the housing 204 about the hinge 302 in the first rotational direction 306.

Further, the biasing assembly 610 retains the shoulders 620 and 622 in engagement by providing a continuous biasing force in the first lateral direction 612. Additionally, the biasing assembly 610 retains the shoulders 620 and 622 in engagement by providing a continuous biasing force in the first rotational direction 306. In this manner, the shoulder 622 of the housing 204 prevents the access panel 202 from rotating about the pivot axis 304. As a result, the latch 614 is in a locked condition. The biasing assembly 610 automatically and/or continuously biases the access panel 202 in the first lateral direction 612 and the first rotational direction 306 such that the hinge 302 is in the first lateral position 400 and the latch 614 is in the locked condition to prevent rotation of the access panel 202 about the pivot axis 304.

Although not shown, in other examples, the housing 204 may include a spring loaded latch to engage a recess or aperture formed in the access panel 202 to retain the access panel 202 in the closed position, or vise-versa. In some such examples, lateral movement of the access panel 202 causes the latch to disengage the access panel.

Figure 7:
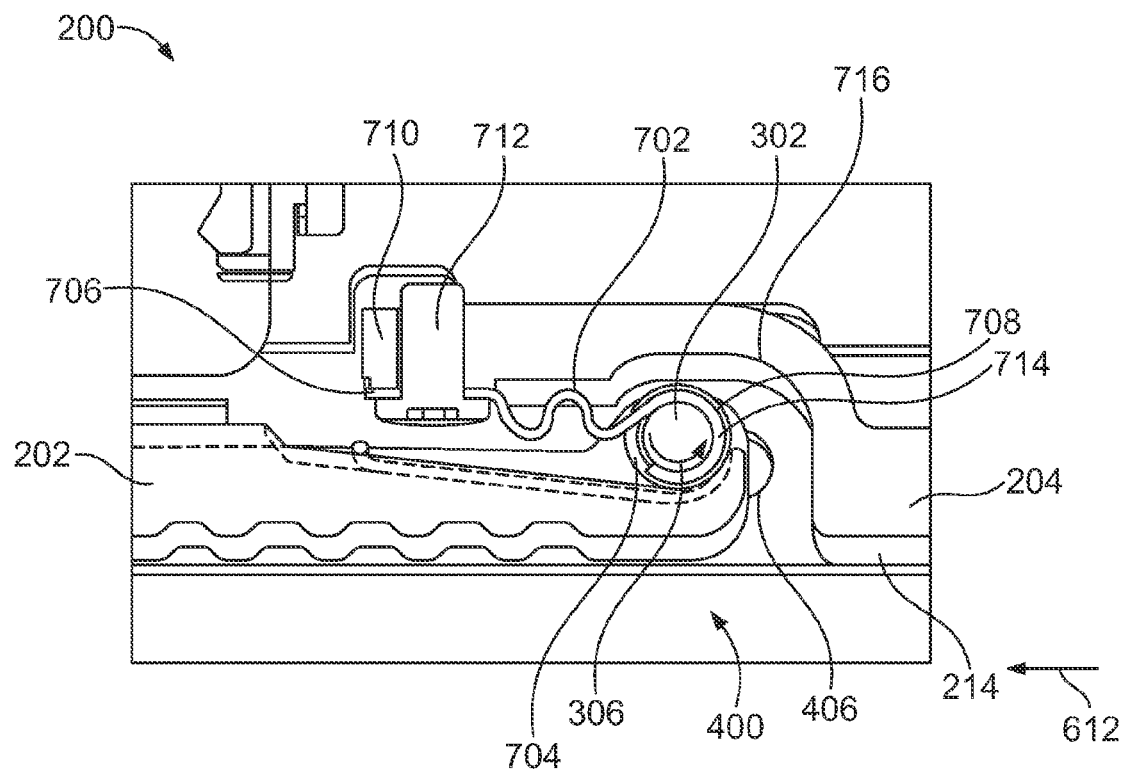
FIG. 7 is an enlarged view of the example access panel of the electronic device of FIG. 6.

FIG. 7 is an enlarged partial view of the example electronic device shown in FIG. 6. Referring to FIG. 7, the biasing assembly 610 includes a first biasing element 702 (e.g., a wave belt spring) and a second biasing element 704 (e.g., a looped torsion spring). The first biasing element 702 biases the access panel 202 laterally relative to the side surface 214 of the housing 204 and the second biasing element 704 rotatably biases the access panel 202 relative to housing 204. More specifically, the first biasing element 702 biases the access panel 202 relative to the housing 204 in the first lateral direction 612 and the second biasing element 704 biases the access panel 202 relative to the housing 204 in the first rotatable direction 306.

The first biasing element 702 has a first end 706 attached to the housing 204 and a second end 708 attached to the access panel 202. More specifically, the first end 706 of the first biasing element 702 has an aperture to receive a fastener 712 and is attached to a wall 710 of the second housing portion 210 via the fastener 712. The second end 708 of the first biasing element 702 is attached to the hinge 302. In this example, the second end 708 of the first biasing element 702 includes a hook or curved end 714 to engage the hinge 302. In other examples, the biasing element 702 may be attached to the housing portion 210 and/or the hinge 302 via, for example, welding and/or any other suitable fastener(s). In some examples, the second end 708 of the biasing element 702 may be attached to the access panel 202 via, for example, welding or any other suitable fastener(s). In such some examples, the second end 708 of the biasing element 702 may be shaped similar to the first end 706 of the biasing element 702.

The first biasing element 702 also includes a wave-like profile or cross-sectional shape to that biases the second end 708 of the first biasing element 702 toward the fastener 712. In other words, because the first end 706 of the first biasing element 702 is attached to the housing 204 and the second end 708 is attached to the hinge 302, the first biasing element 702 imparts a pulling force to the hinge 302 to bias the hinge 302 laterally in the first lateral direction 612. Thus, the first biasing element 702 positions or biases the hinge 302 toward the first lateral position 400 relative to the slot 406. The second biasing element 704 is coupled to the access panel 202 via the hinge 302.

As shown in FIG. 7, the second housing portion 210 also includes a recessed opening or area 716 that provides a clearance to enable the hinge 302 and/or the access panel 202 to slide and/or rotate relative to the housing 204 without interference. The wall 710 of the second housing portion 210 defines at least a portion of the recessed opening or area 716.

Figure 8:
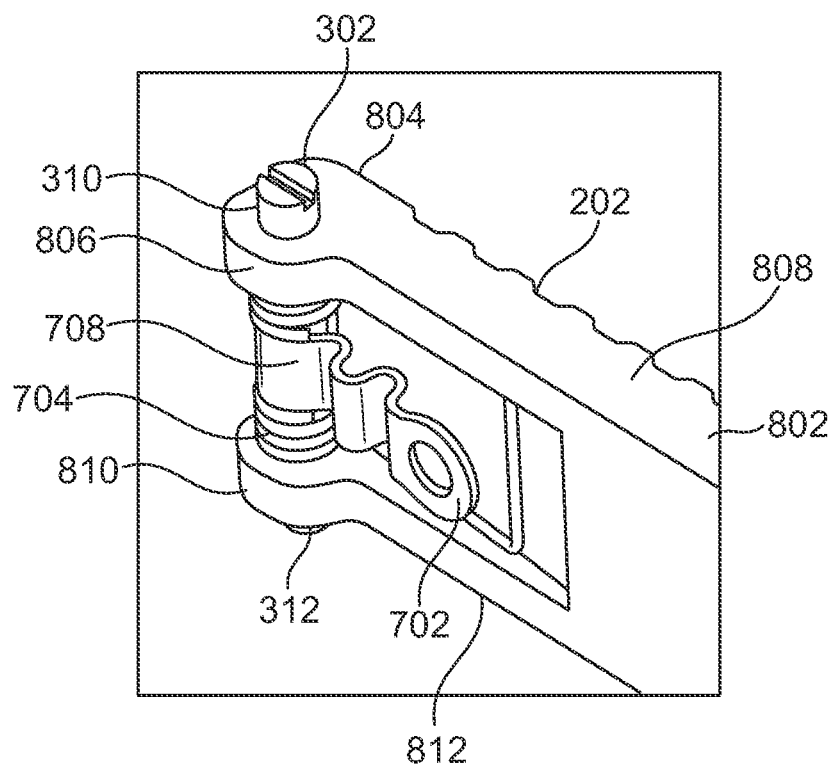
FIG. 8 is a partial perspective view of the example access panel of FIGS. 2-7.

FIG. 8 is a partial perspective view of the example access panel 202 of FIGS. 2-7. The access panel 202 is a door having an elongated body 802. An end 804 of the access panel 202 opposite the latch 614 (FIG. 6) includes a first boss 806 adjacent a first surface 808 of the body 802 and a second boss 810 adjacent a second surface 812 of the body 802 opposite the first surface 808. Each of the first and second bosses 806 and 810 includes an aperture to receive the hinge 302. When coupled to the access panel 202 as shown in FIG. 8, the first portion 310 of the hinge 302 extends past the first surface 808 of the access panel 202 and the second portion 312 of the hinge 302 extends past the second surface 812 of the access panel 202. As shown in FIG. 8, the hinge 302 couples the first biasing element 702 and the second biasing element 704 to the access panel 202.

Figure 9:
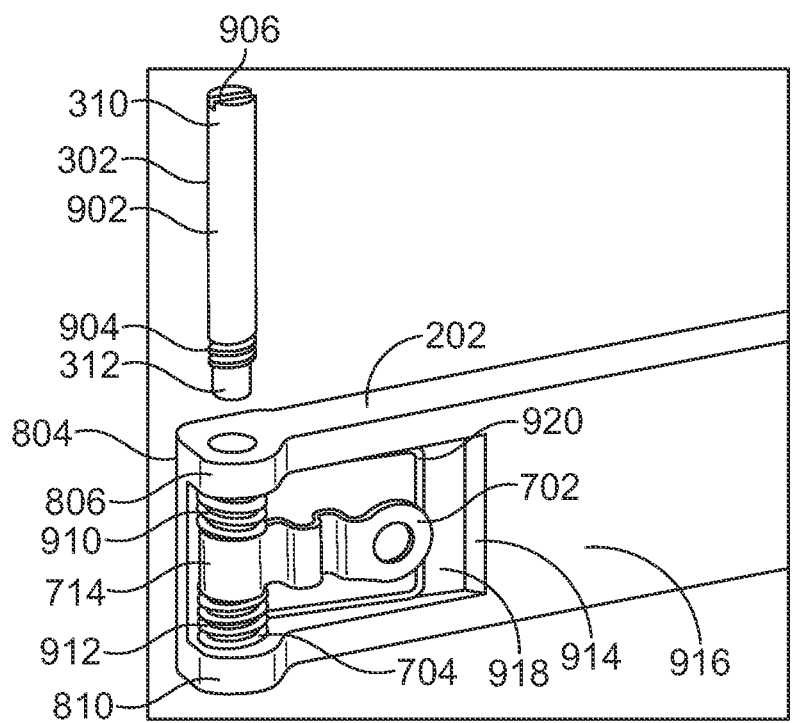
FIG. 9 is a partial exploded view of the example access panel of FIGS. 2-8.

FIG. 9 is a partial exploded view of the example access panel 202 of FIGS. 1-8. The hinge 302 of the illustrated example is a pin 902 that has a cylindrical body or shape. The pin 902 includes at least a partially threaded portion 904 positioned along a length of the body and a tool access or slot 906 to receive a tool (e.g., a screw driver) to couple the pin 902 to the access panel 202. More specifically, the threaded portion 904 is positioned adjacent (e.g., spaced away from) the second portion 312 of the pin 902 and the slot 906 is formed at the first portion 310 of the pin 902. In this example, the aperture of the first boss 806 is non-threaded and the aperture of the second boss 810 is threaded. As a result, the first boss 806 slidably receives the pin 902 and the second boss 810 threadably couples the pin 902 to the access panel 202. In some examples, the pin 902 of the illustrated example may be coupled to the boss 810 via, for example, press-fit, interference fit, chemical fasteners (e.g., adhesive) and/or any other suitable fastener(s). In such some examples, the pin 902 may have a tapered profile that engages a tapered profile of the apertures of the first and/or second bosses 806 and 810.

Prior to coupling the pin 902 to the access panel 202, the first and second biasing elements 702 and 704 are positioned between the first and second bosses 806 and 810. The curved portion 714 of the first biasing element 702 forms an opening to receive the pin 902 and the second biasing element 704 includes first and second portions 910 and 912 defining openings to receive the pin 902. More specifically, the openings of the curved end 714 and the first and second portions 910 and 912 coaxially align with the apertures of the first and second bosses 806 and 810. Further, as shown, the curved portion 714 of the first biasing element 702 is positioned between first and second portions 910 and 912 of the second biasing element 704.

In the illustrated example, the first and second biasing elements 702 and 704 are positioned in a recess or cavity 914 formed in an inner surface 916 of the access panel 202 adjacent the end 804. In this example, the recess 914 defines a tapered portion or tapered wall 918 that engages a portion 920 of the second biasing element 704. As a result, the tapered wall 918 provides a pre-load to the second biasing element 704.

The access panel 202 may be pre-assembled prior to attaching or coupling to the housing 204. In particular, the biasing elements 702 and 704 can be attached to the access panel 202 via the pin 902. The assembled access panel 202 may then be coupled to the housing 204 by positioning the portions 310 and 312 of the pin 902 in the respective slots 408 and 406 of the housing portions 208 and 210. The first biasing element 702 may then be attached to the housing 204 via the fastener 712. In this manner, the access panel 202 may be coupled or assembled with the housing 204 and/or the electronic device 200 as a last step in an assembly process, which can significantly reduce manufacturing and/or assembly complexity.

FIG. 10 illustrates the example access panel 202 of the example electronic device 200 in the intermediate position 502. Referring to FIGS. 2-10, in operation, the first biasing element 702 biases the hinge 302 to the first lateral position 400 relative to the slots 404 and 406. As a result, the second biasing element 704 is prevented from rotating the access panel 202 in the first rotational direction 306 (e.g., to an open position) because the access panel 202 is biased toward the latch 614 such that the shoulder 620 of the access panel 202 engages the shoulder 622 of the housing 204. To move the access panel 202 to an open position, an external force 1002 is applied to the access panel 202 to laterally shift or move the hinge 302 from the first lateral position 400 (e.g., as shown in FIGS. 3, 4, 6 and 7) to the second lateral position 500 (e.g., as shown in FIGS. 5 and 10). As shown in FIG. 10, the external force 1002 is substantially parallel relative to the side surface 212 of the housing 204 and/or the outer surface 214 of the access panel 202 to move or disengage the access panel 202 from the housing 204. In the illustrated example, the outer surface 214 of the access panel 202 may include a plurality of ridges 1004 to provide a gripping surface. In other examples, the outer surface 214 of the access panel 202 may include a detent, a rubber, paint and/or any other grip to facilitate sliding the access panel 202 relative to the housing 204.

As shown in FIG. 10, the hinge 302 slides or moves relative to the housing 204 to the second lateral position 500 to unlock, release or unlatch the access panel 202 from the housing 204. In particular, in the unlocked position, the shoulder 620 of the access panel 202 disengages or moves away from the shoulder 622 of the second housing portion 210.

FIG. 11 is an enlarged partial view of the example electronic device 200 shown in FIG. 10 illustrating the hinge 302 in the second lateral position 500 in solid lines and the hinge 302 in the first lateral position 400 in dashed lines prior to moving to the second lateral position 500 under the influence of the external force 1002. As shown in FIG. 11, the hinge 302 (i.e., the pin) shifts from the first lateral position 400 to the second lateral position 500 relative to the slots 404 and 406 when the external force 1002 is provided to the access panel 202 in a direction opposite the first lateral direction 612 of FIG. 6. In other words, the access panel 202 moves against the biasing force of the first biasing element 702 in a second lateral direction 1104 away from the fastener 712. As shown, the first biasing element 702 moves to an extended or stretched state when the hinge 302 is in the second lateral position 500.

In addition, when the external force 1002 applied to the access panel 202, another external force 1102 may be applied to the side surface 612 of the access panel in a direction perpendicular to the external force 1002. For example, a user may simultaneously impart the external force 1002 and the external force 1102 when sliding the access panel 202 to the intermediate position 502. As a result, the external force 1102 prevents or significantly reduces rotation of the access panel 202 relative to the housing 204 when the hinge 302 is in the second lateral position 500 and the shoulder 620 is disengaged from the shoulder 622. In other words, the access panel 202 rotates relative to the housing 204 when the external force 1102 is removed and/or imparts a force to the outer surface 214 of the access panel 202 that is less than the rotational force imparted to the inner surface 916 of the access panel 202 by the second biasing element 704. Thus, once the external forces 1002 and 1102 are removed and the hinge 302 is in the second lateral position 500, the second biasing element 704 rotates the access panel 202 to an open position.

Figure 12:
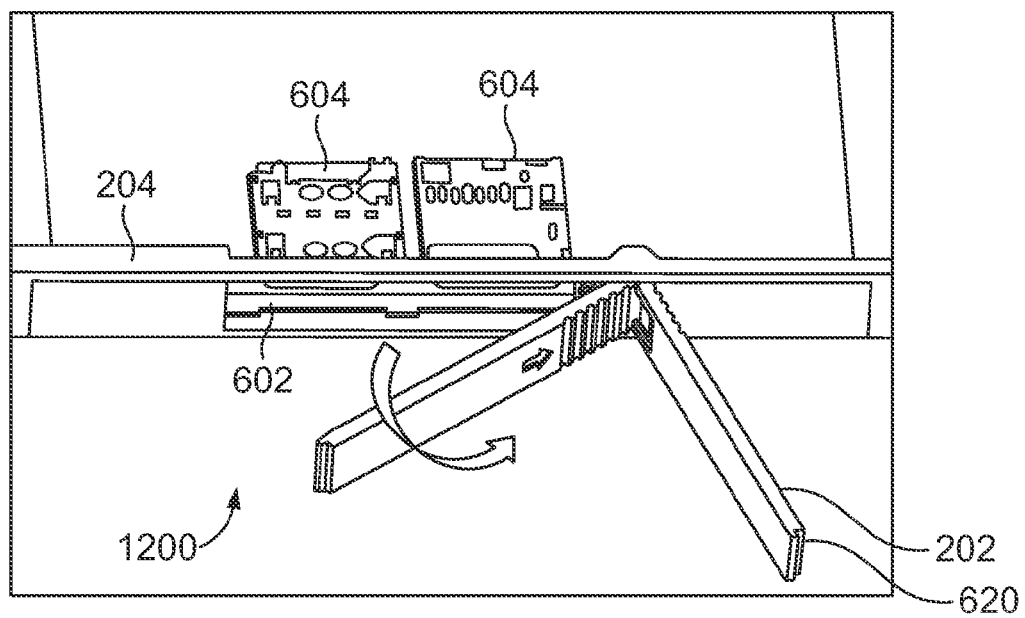
FIG. 12 is a perspective view of a portion of the electronic device showing the access panel in the open position.

FIG. 12 illustrates the access panel 202 in an open position 1200. After the hinge 302 is shifted laterally to the second lateral position 500 as shown in FIGS. 5, 10 and 11, the second biasing element 704 causes the access panel 202 to rotate relative to the housing 204 in the first rotational direction 306. In other words, the shoulders 620 and 622 disengage to allow the second biasing element 704 to rotate the access panel 202. As the shoulder 620 of the access panel 202 moves past the shoulder 622 of the housing 204 when the second biasing element 704 rotates the access panel 202, the first biasing element 702 (e.g., simultaneously) moves or biases the hinge 302 to the first lateral position 400 when the external forces 1002 and 1102 are not imparted to the access panel 202. However, because the shoulder 620 of the access panel 202 moves past the shoulder 622 of the housing 204, the access panel 202 can rotate about the hinge 302 when the hinge 302 is in the first lateral position 400. In the open position 1200, the access panel 202 allows access to the opening 602 of the housing 204 and, thus, the card holders 604.

Figure 13:
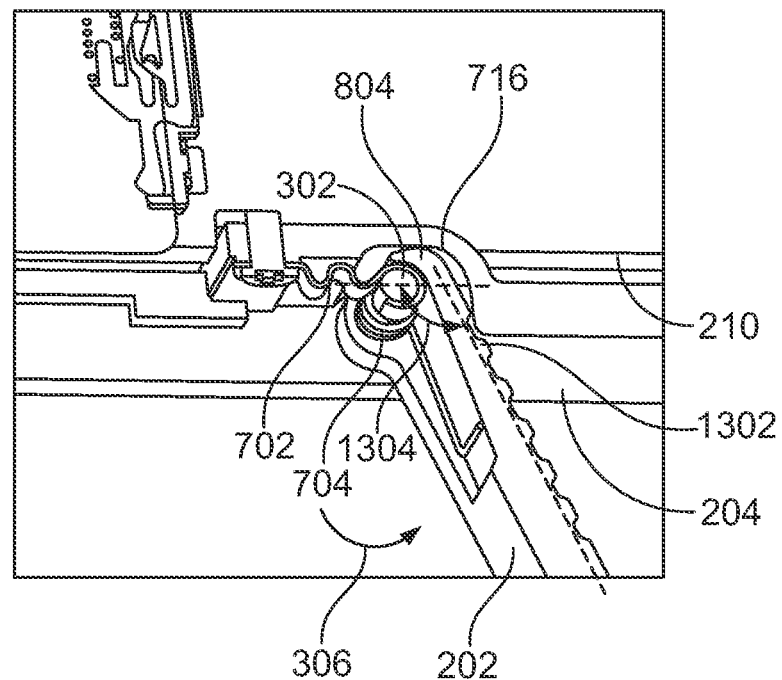
FIG. 13 is an enlarged partial view of the example the electronic device of FIG. 12.
Figure 14:
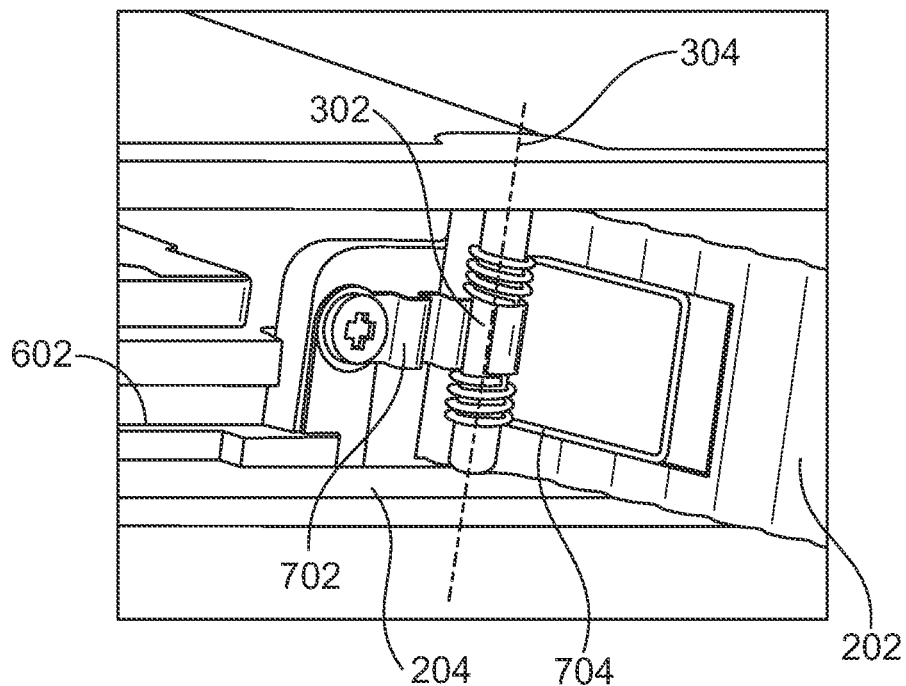
FIG. 14 is another enlarged partial view of the example electronic device of FIG. 12.

FIGS. 13 and 14 are partial enlarged views of the example electronic device 200 when the access panel 202 is in the open position 1200. Referring to FIGS. 13 and 14, the first biasing element 702 is in a retracted or initial state to bias the hinge 302 to the first lateral position 400. Further, the second biasing element 704 biases the access panel 202 in the first rotational direction 306 until a portion 1302 of the access panel 202 engages the housing 204. Thus, the housing 204 provides a stop to prevent further rotation of the access panel 202 in the first rotational direction 306. Additionally, the recessed portion 716 of the second housing portion 210 receives the end 804 of the access panel 202 to enable the access panel 202 to move to the open position 1200 with minimal or no interference. As shown in FIGS. 13 and 14, in the open position, the access panel 202 is positioned at an angle 1304 greater than 90 degrees relative to the side surface 214 of the housing 204 adjacent the opening 602 to facilitate access to the opening 602. More specifically, the angle 1304 may be approximately between 95 degrees and 125 degrees.

Figure 15:
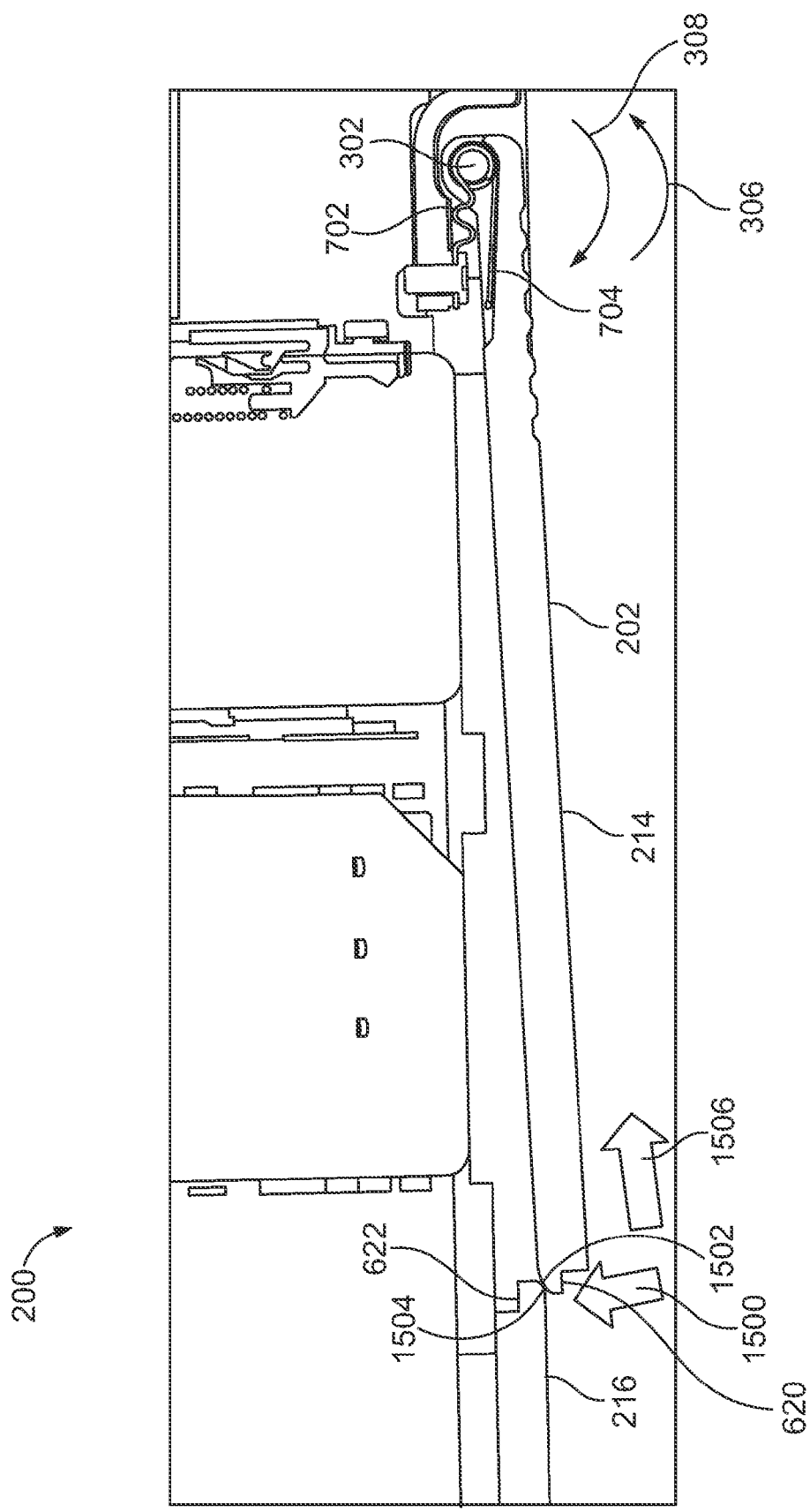
FIG. 15 is a plan view of the example electronic device similar to FIGS. 6 and 10, but showing the example access panel moving to the closed position.

FIG. 15 illustrates the example electronic device 200 showing the access panel 202 moving toward the closed position 402. To move the access panel 202 to the closed position 1200, an external force 1500 is applied to the outer surface 214 of the access panel 202 to rotate the access panel 202 in the second rotational direction 308 against the rotational biasing force of the second biasing element 704. The access panel 202 is rotated in the second rotational direction 308 until an inner surface portion 1502 of the access panel 202 (e.g., opposite the shoulder 620) engages an outer surface portion 1504 of the housing 204 (e.g., opposite the shoulder 622). The surfaces 1502 and 1504 may include tapered, curved or rounded profiles to facilitate movement (e.g., sliding movement) of the access panel 202 relative to the housing 204 (e.g., reduce friction between the surfaces 916 and 216). Engagement between the inner surface portion 1502 and the outer surface portion 1504 causes the access panel 202 to slide or shift laterally to the second lateral position 500 against the biasing force of the first biasing element 702.

As a result, the hinge 302 shifts to the second lateral position 500 to enable the shoulder 620 of the access panel 202 to move and align with the shoulder 622 of the housing 204 as the access panel 202 is continued to be rotated in the second rotational direction 308 after engagement between the surfaces 1502 and 1504. Thus, the frictional engagement between the surfaces 1502 and 1504 causes the hinge 302 of the access panel 202 to shift in a direction 1506 (e.g., an angular direction) toward the second lateral position 500 when the access panel 202 is rotated in the second rotational direction 308. The access panel 202 is rotated in the second rotational direction 308 until the outer surface 214 of the access panel 202 is substantially parallel relative to the side surface 216 of the housing 204 to align the shoulders 620 and 622. After the shoulders 620 and 622 are aligned, the external force 1500 is removed from the access panel 202 and the first biasing element 702 moves or shifts the hinge 302 to the first lateral position 400 to cause the shoulder 620 of the access panel 202 to engage the shoulder 622 of the housing 204 to prevent the second biasing element 704 from rotating the access panel 202 in the first rotational direction 306.

The example access panels disclosed herein provide a relatively seamless profile when coupled to a housing of an electronic device and/or facilitate opening and closing an access panel or door of an electronic device. More specifically, the example access panels disclosed herein enable single-hand operation to open or close the access panel. Additionally or alternatively, in the open position, the example access panels disclosed herein provide greater access to an opening of the housing by rotating to a position greater than ninety degrees relative to the housing while remaining pivotally coupled to the housing in the open position. Additionally or alternatively, the example access panels disclosed herein can be positioned on any surface of the electronic device and/or can be positioned at relatively a midpoint between corners of a housing of an electronic device. In other words, the access panels disclosed herein do not need to define a corner of a housing. Although in some examples, the access panels disclosed herein may define a corner of a housing. Further, the access panels disclosed herein lock automatically when the access panel is moved to a closed position. Automatic locking of the access panel is provided by a bi-directional biasing element or assembly. Additionally or alternatively, the example access panels or doors disclosed herein facilitate assembly of the electronic device. For example, the first and second biasing elements 702 and 704 may be pre-assembled with the access panel 202 via the pin 902. The pre-assembled access panel may be attached to the housing as, for example, a final step in an assembly process of an electronic device.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. An electronic device comprising:
a housing having an opening to access a card holder;
an access panel coupled to the housing to cover the opening, the access panel to slide and rotate relative to the housing when the access panel moves between an open position to allow access to the opening and a closed position to cover the opening;
a first biasing element having a first end attached to a first end of the access panel and a second end attached to the housing, the first biasing element to bias the access panel laterally relative to the housing, wherein a second end of the access panel and a portion of the housing engage to provide a latch when the access panel is in the closed position, and the first biasing element biases the access panel laterally toward the portion of the housing when in the closed position; and second biasing element coupled to the access panel to cause the access panel to rotate in a first rotational direction relative to the housing.

2. The electronic device of claim 1, wherein the access panel further comprises a hinge to define a pivot axis, wherein the first and second biasing elements are coupled to the hinge.

3. The electronic device of claim 2, wherein the hinge comprises a pin coupled to the access panel.

4. The electronic device of claim 3, wherein the housing includes a slot to receive the pin, the slot to enable a longitudinal axis of the pin to shift between a first lateral position and a second lateral position to move the access panel between the open position and the closed position.

5. The electronic device of claim 4, wherein the first biasing element biases the pin to the first lateral position defined by the slot.

6. The electronic device of claim 1, wherein the access panel defines a side surface of the housing between a first corner of the housing and a second corner of the housing when the access panel is in the closed position.

7. An electronic device comprising:
an access panel pivotally coupled to a housing of the electronic device via a hinge, the hinge positioned in a slot of the housing to enable a longitudinal axis of the hinge to move laterally between a first lateral position and a second lateral position when the access panel moves between a closed position and an intermediate position, the intermediate position being between the closed position and an open position, the hinge to move to the second lateral position to unlock the access panel from the housing; and
a first biasing element coupled to a first end of the access panel and the housing to bias the hinge toward the first lateral position, wherein a second end of the access panel and a portion of the housing engage to provide a latch when the access panel is in the closed position, and the first biasing element biases the access panel laterally toward the portion of the housing when in the closed position.

8. The electronic device of claim 7, wherein the first biasing element has a first end attached to the hinge of the access panel and a second end attached to the housing.

9. The electronic device of claim 7, wherein the access panel slides relative to the housing to move the hinge between the first and second lateral positions.

10. The electronic device of claim 7, wherein the first biasing element causes the hinge of the access panel to slide toward the first lateral position and an external force applied to the access panel causes the hinge to move to the second lateral position.

11. The electronic device of claim 7, further comprising a second biasing element coupled to the hinge to cause the access panel to rotate relative to the housing about the hinge in a first rotational direction to rotate the access panel to the open position.

12. The electronic device of claim 11, wherein the latch retains the access panel in the closed position and prevent the second biasing element from rotating the access panel to the open position when the hinge is in the first lateral position.

13. The electronic device of claim 12, wherein the latch is positioned adjacent an end of the access panel and is to engage a shoulder housing.

14. The electronic device of claim 13, wherein the latch comprises a shoulder formed via a stepped surface.

15. The electronic device of claim 7, wherein a first end of the hinge is to engage a first slot formed in a first housing portion of the housing and a second end of the hinge is to engage a second slot formed in a second housing portion of the housing.

16. The electronic device of claim 7, wherein an outer surface of the access panel is substantially flush relative to a side surface of the housing when the access panel is in the closed position.

17. A method comprising:
pivotally coupling a first end of an access panel to a housing of an electronic device, the access panel to pivot about a pivot axis;
slidably coupling the access panel to the housing to enable the pivot axis to slide relative to the housing between a first lateral position and a second lateral position;
biasing the pivot axis to the first lateral position to cause a latch to retain the access panel in a closed position, wherein a second end of the access panel and a portion of the housing engage to provide the latch, and biasing the pivot axis to the first lateral position biases the access panel laterally toward the portion of the housing when in the closed position; and
biasing the pivot axis to rotate in a first rotational direction about the pivot axis to move the access panel to an open position when the latch is disengaged.

18. The method of claim 17, wherein biasing the pivot axis to the first position comprises attaching a first end of a spring to the housing and attaching a second end of the spring to the access panel.

19. The method of claim 17, wherein slidably coupling the access panel to the housing comprises positioning the pivot axis in a slot formed in the housing to enable the pivot axis to shift laterally relative to the housing.

* * * * *